(12) United States Patent
Irving et al.

(10) Patent No.: US 11,768,445 B2
(45) Date of Patent: Sep. 26, 2023

(54) METHOD AND APPARATUS TO REGISTER TEMPLATE WITH SPATIAL LIGHT MODULATOR

(71) Applicant: CANON KABUSHIKI KAISHA, Tokyo (JP)

(72) Inventors: James W. Irving, Austin, TX (US); Mehul N. Patel, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 24 days.

(21) Appl. No.: 17/407,786

(22) Filed: Aug. 20, 2021

(65) Prior Publication Data

US 2023/0053682 A1  Feb. 23, 2023

(51) Int. Cl.
*G03F 9/00* (2006.01)
*G03F 7/00* (2006.01)

(52) U.S. Cl.
CPC .................. *G03F 9/7042* (2013.01); *G03F 7/70116* (2013.01)

(58) Field of Classification Search
CPC ... G03F 9/7042; G03F 7/70116; G03F 7/0002; B29C 33/424; B29C 59/02
See application file for complete search history.

(56) References Cited

U.S. PATENT DOCUMENTS

| | | | |
|---|---|---|---|
| 6,870,554 B2 | 3/2005 | Jain | |
| 6,922,483 B2 | 7/2005 | Doane | |
| 10,663,869 B2 | 5/2020 | Khusnatdinov et al. | |
| 2017/0144363 A1 | 5/2017 | Nakagawa et al. | |
| 2018/0210346 A1 | 7/2018 | Laidig et al. | |
| 2018/0301331 A1 | 10/2018 | Yoshida | |
| 2020/0292935 A1 | 9/2020 | Yoshida | |
| 2020/0379342 A1 | 12/2020 | Tavakkoli Kermani Ghariehali et al. | |
| 2021/0124260 A1* | 4/2021 | Tavakkoli Kermani Ghariehali et al. | B29C 59/02 |
| 2021/0124274 A1 | 4/2021 | Roy et al. | |
| 2021/0191256 A1* | 6/2021 | Cherala et al. | B29C 35/0805 |

* cited by examiner

*Primary Examiner* — Peter B Kim
(74) *Attorney, Agent, or Firm* — CANON U.S.A., INC.; IP Division (57) ABSTRACT

A formable material in contact with a template is irradiated to form a reference film using a predefined registration pattern associated with a spatial light modulator (SLM). The reference film is inspected to generate positional information of elements of the SLM relative to an imprint field edge. Positional offset of the elements of the SLM with respect to a holder of the template based on the positional information is determined. Control parameters for the SLM are determined based on the positional offset.

20 Claims, 8 Drawing Sheets

METHOD AND APPARATUS TO REGISTER TEMPLATE WITH SPATIAL LIGHT MODULATOR

BACKGROUND

Field

One disclosed aspect of the embodiments relates to nanoimprint lithography. In particular, one disclosed aspect of the embodiments relates to techniques to register a template with a spatial light modulator.

Description of the Related Art

Nanoimprint lithography for semiconductor fabrication has become increasingly popular. It has been used in a variety of fabrication processes including layers of integrated circuit devices such as memory devices, microprocessors, and logic circuits. One such system uses spatial light modulation to modulate a radiation source to irradiate a formable material on a substrate. Light modulation can be performed by a number of techniques, including Digital Micromirror/ Mirror Device (DMD), Liquid Crystal Device (LCD), mirror array, etc.

The Digital Micromirror/ Mirror Device (DMD) is an optical micro-electrical-mechanical system (MEMS) that contains an array of highly reflective micro mirrors to perform digital spatial modulation (DSM). Specially designed optics are used to provide accurate curing in lithography imprinting systems.

One step in the fabrication process is to register the DMD location. Existing techniques perform the registration by turning on and off individual mirrors. The drawback of this technique is that it is time consuming and is unacceptable in a manufacturing environment.

SUMMARY

A formable material is irradiated to form a reference film from a template using a predefined registration pattern associated with a spatial light modulator (SLM). The reference film is inspected to generate positional information of elements of the SLM relative to an imprint field edge. Positional offset of the elements of the SLM with respect to a template holder of the template based on the positional information is determined. Control parameters for the SLM are determined based on the positional offset.

Further features of the disclosure will become apparent from the following description of exemplary embodiments with reference to the attached drawings.

DESCRIPTION OF THE EMBODIMENTS

One disclosed aspect of the embodiments includes a technique to perform registration of a SLM relative to template mesa. A formable material in contact with the template mesa is irradiated to form a reference film using a predefined registration pattern associated with a spatial light modulator (SLM). When not in an image analysis mode, the reference film is inspected to generate positional information of elements of the SLM relative to an imprint field edge. Positional offset of the elements of the SLM with respect to a template holder of the template based on the positional information is determined. Control parameters for the SLM are determined based on the positional offset.

Figure 1:
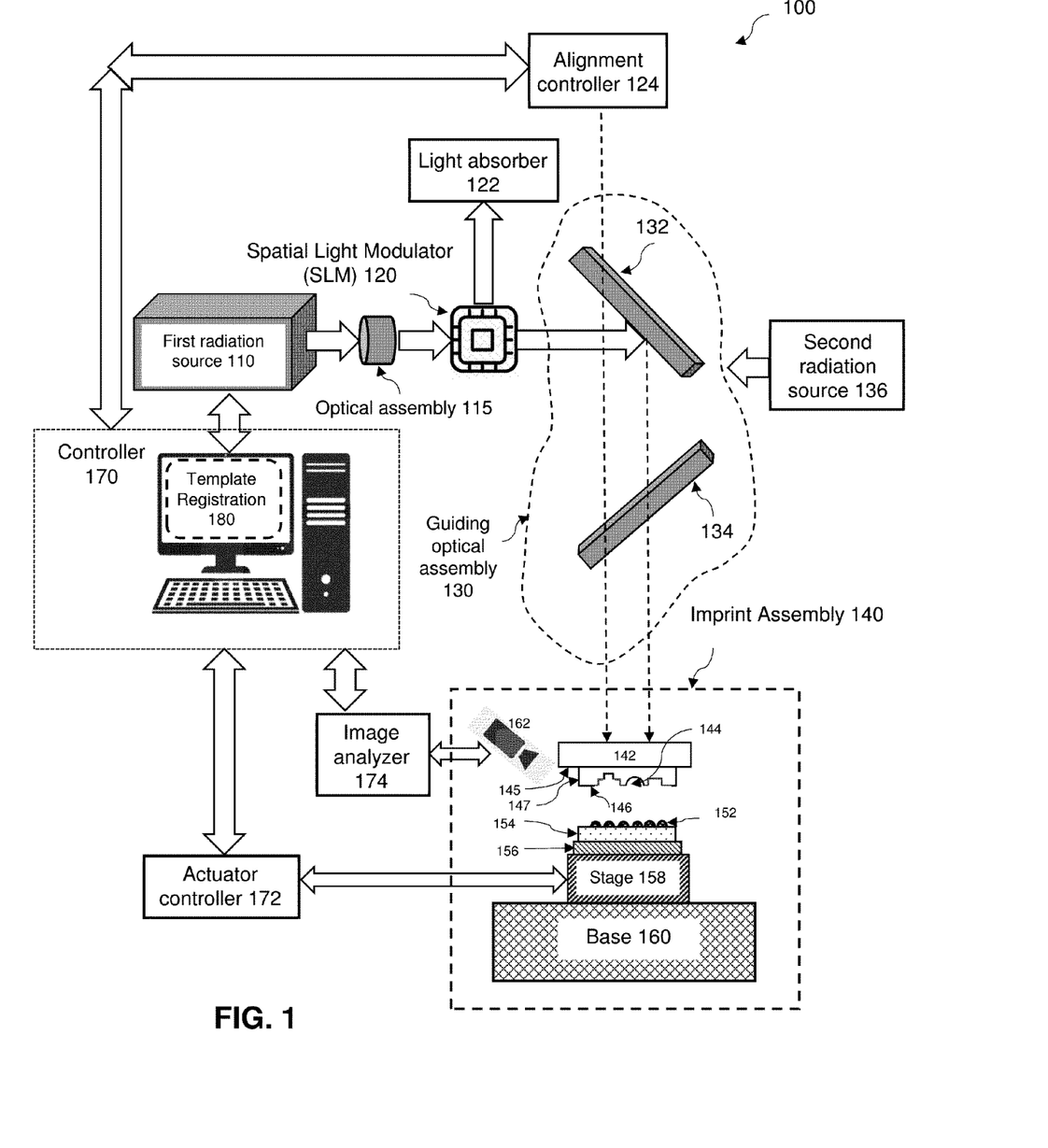
FIG. 1 is a diagram illustrating a system for DMD registration.

FIG. 1 is a diagram illustrating a system for SLM registration in imprint lithography. The system 100 includes a first radiation source 110, an optical assembly 115, an SLM 120, a guiding optical assembly 130, a second radiation source 136, an imprint assembly 140, and actuator controller 172, and an image analyzer 174. The system 100 may include more or less than the above components. For example, the second radiation source 136 may not be needed.

The first radiation source 110 radiates actinic energy for curing a formable material in the imprint assembly 140 through the SLM 120 and the guiding optical assembly 130. The energy source may supply ultra-violet (UV) light. The optical assembly 115 receives the light energy at the end of the exposure path and directs the energy through a system of optical components to the SLM 120 to irradiate the photo-curable or formable material in the imprint assembly 140. It may include lenses that are designed and positioned at positions to achieve the proper modulation for the light source. The optical assembly 115 may magnify the pattern in the SLM 120 by a magnification factor prior to projecting the pattern on the substrate in the imprint assembly 140.

The imprint assembly 140 includes components used for nanoimprint lithography. It includes a template 142 having a template pattern 144 and mesa 146, a formable material 152, a substrate 154, a substrate chuck 156, a substrate positioning stage 158 that holds the substrate chuck or substrate holder 156 and the substrate 154 on which a patterned layer is formed, and an image sensor 162. The substrate holder 156 holds the substrate 154. A template holder (not shown) holds the template 142. The stage 158 is positioned above a base 160. The imprint assembly 140 may also include other components which are not shown for clarity. These components include a control and sensing assembly to perform control and sensing functions for the imprinting on the substrate, a field camera to provide images of the spread of the formable material and to keep track of the imprinting process, a droplet inspection system to inspect droplets. The template 142 may be made from a material such as quartz, silicon, organic polymers, or other suitable materials. The template pattern 144 includes features that have recesses and protrusions corresponding to the pattern to be formed on the substrate 154. In an alternative embodiment, the template pattern 142 is featureless which is used to form a planarized surface on the substrate 142. The mesa 146 may be surrounded by a recessed surface 145 on the front side of the template 142. Mesa sidewalls 147 connect the recessed surface 145 to the surface of the pattern 144. One objective of the embodiment is to generate the SLM registration with respect to the mesa 146. The term registration here refers to the correspondence between the individual mirrors (or also loosely called "pixels") in the SLM 120 (when the SLM is a DMD) and the locations of the individual areas on the mesa 146.

The substrate 154 may be coated with a thin adhesion layer to help in the adhesion of the photo-curable or formable material 152 after curing to the substrate 154. The substrate 154 may be held by the substrate chuck 156 and both are positioned by the stage 158. The stage 158 may be controlled by an actuator controller 172 to move the substrate and substrate chuck assembly. The photo-curable or formable material 152 is used to transfer the template pattern 144 to the semiconductor substrate 154. It may be a resist and include a formable material that takes on an inverse of shapes on a patterning surface from a mold and/or a template. The photo-curable or formable material 152 may be cured by the energy provided by the radiation source while the template pattern 144 is in contact with the formable material 152 on the substrate 154. In an embodiment, after the photo-curable or formable material 152 is cured additional semiconductor manufacturing processing may be performed on the substrate 154 in a processing step so as to create an article of manufacture (e.g. semiconductor device). In an embodiment, each field includes a plurality of devices. The further semiconductor manufacturing processing in the processing step may include etching processes to transfer a relief image into the substrate that corresponds to the template pattern 144 in the patterned layer or an inverse of that template pattern 144. The further processing in the processing step may also include known steps and processes for article fabrication, including, for example, inspection, curing, oxidation, layer formation, deposition, doping, planarization, etching, formable material removal, dicing, bonding, packaging, and the like. The substrate 154 may be processed to produce a plurality of articles (devices).

The SLM 120 is a device that contains an array of spatial elements to modulate the spatio-temporal distribution of the actinic radiation from the radiation source 110. The SLM 120 may also modulate the spatio-temporal distribution of the thermal radiation from a thermal radiation source (not shown) which may be used to cause the thermal expansion of one or both of the substrate and template. The spatial elements may be arranged in a two-dimensional array with a pitch, which is the smallest distance between centers of two adjacent spatial elements. In one embodiment, the SLM 120 is a digital micromirror device (DMD). The spatial elements are the pixels and the pitch is the pixel pitch. In an alternative embodiment, the SLM 120 is a transmissive liquid crystal device in which the transmissivity of each of the spatial elements is adjustable. In an alternative embodiment, the SLM 120 is a reflective liquid crystal on silicon device in which the reflectivity of each of the spatial elements is adjustable.

The image sensor 162 obtains an image of the result of the imprinting during calibration. In one embodiment, this result is the reference film produced after the curing process. The image sensor 162 is controlled by the image analyzer 174. The image analyzer 174 may include specialized hardware components such as memory, signal processor to perform image analysis on an image of the reference film.

The controller 170 is a computing subsystem that performs control functions for the system. These control functions include, but are not limited to, the following: template registration 180, image analysis, stage positioning (for the stage 158), alignment controller 124, and various control functions such as radiation source control. The architecture of the controller 170 will be discussed in FIG. 8.

The second radiation source 136 provides an additional actinic radiation source. The radiation emitted from the second radiation source 136 is guided by the guiding optical assembly 130 which may include appropriate optical components such as the mirrors 132 and 134.

The SLM 120 may include a plurality of elements or pixels. These pixels are individually controlled by the controller 170. In one embodiment, the SLM 120 is a DMD. In this system. A pixel may have two states: ON and OFF. The ON state is the active state in which the radiation is directed to irradiate the formable material 152. In the OFF state, no curing is performed. When the SLM 120 is implemented by a DMD, the individual micromirrors in the DMD are controlled to deflect the light to two optical paths. One path corresponds to the ON state and is directed to the substrate 154. One path corresponds to the OFF state in which the reflected light is directed to a light absorber or beam dump 122. Accordingly, changing the state of a pixel is to move the micromirror from a first angle to a second angle.

Figure 2:
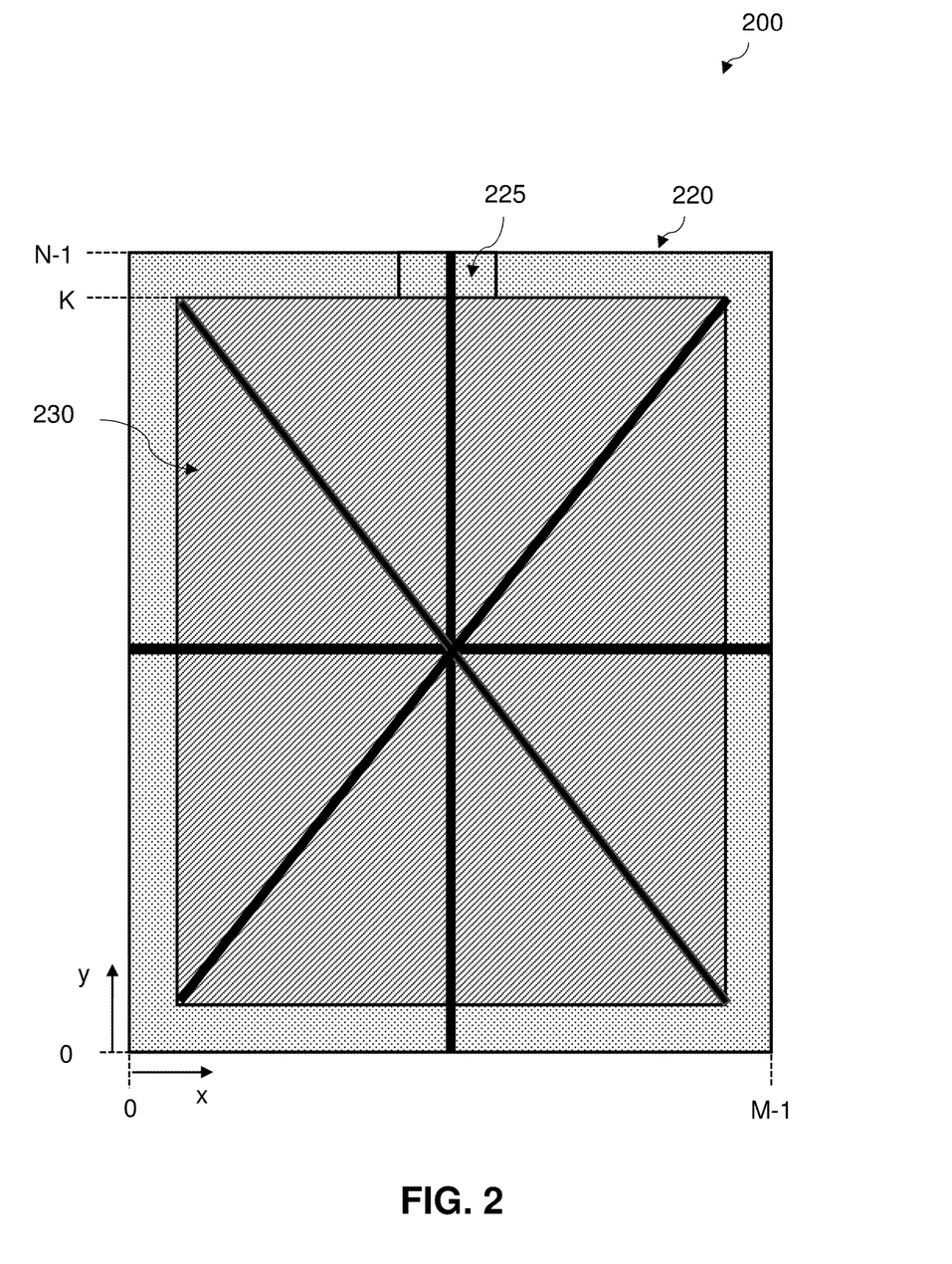
FIG. 2 is a diagram illustrating an overall DMD registration pattern.

FIG. 2 is a diagram illustrating a DMD overall registration pattern 200. The DMD overall registration pattern 200 includes a rectangle 220 that corresponds to the mesa 146. The pattern includes a pattern of OFF pixels and ON pixels. For registration, it is useful to use lines that have geometrical significance. These may include the vertical line, the horizontal line, and the diagonal lines. The OFF pixels are used to designate these lines. Around the rectangle is the periphery positioned on top, bottom, left side, and right side of the rectangle 220. For identification purposes, the individual pixel is recorded with the coordinates along the horizontal axis (x-coordinate) and the vertical axis (y-coordinate). As shown in FIG. 2, there are M columns, numbered 0 to M-1 along the x-axis, and N rows, numbered 0 to N-1 along the y-axis.

In the rectangle 220, the shaded area 230 include ON pixels. The black lines include OFF pixels. The bands around the periphery contain the patterns including ON and OFF pixels that are predefined to provide easy and fast registration and identification. To illustrate the pattern, a rectangle 225 is situated between row K and N-1 and in the middle around the vertical center line. This rectangle 225 is near the edge of the mesa.

Figure 3:
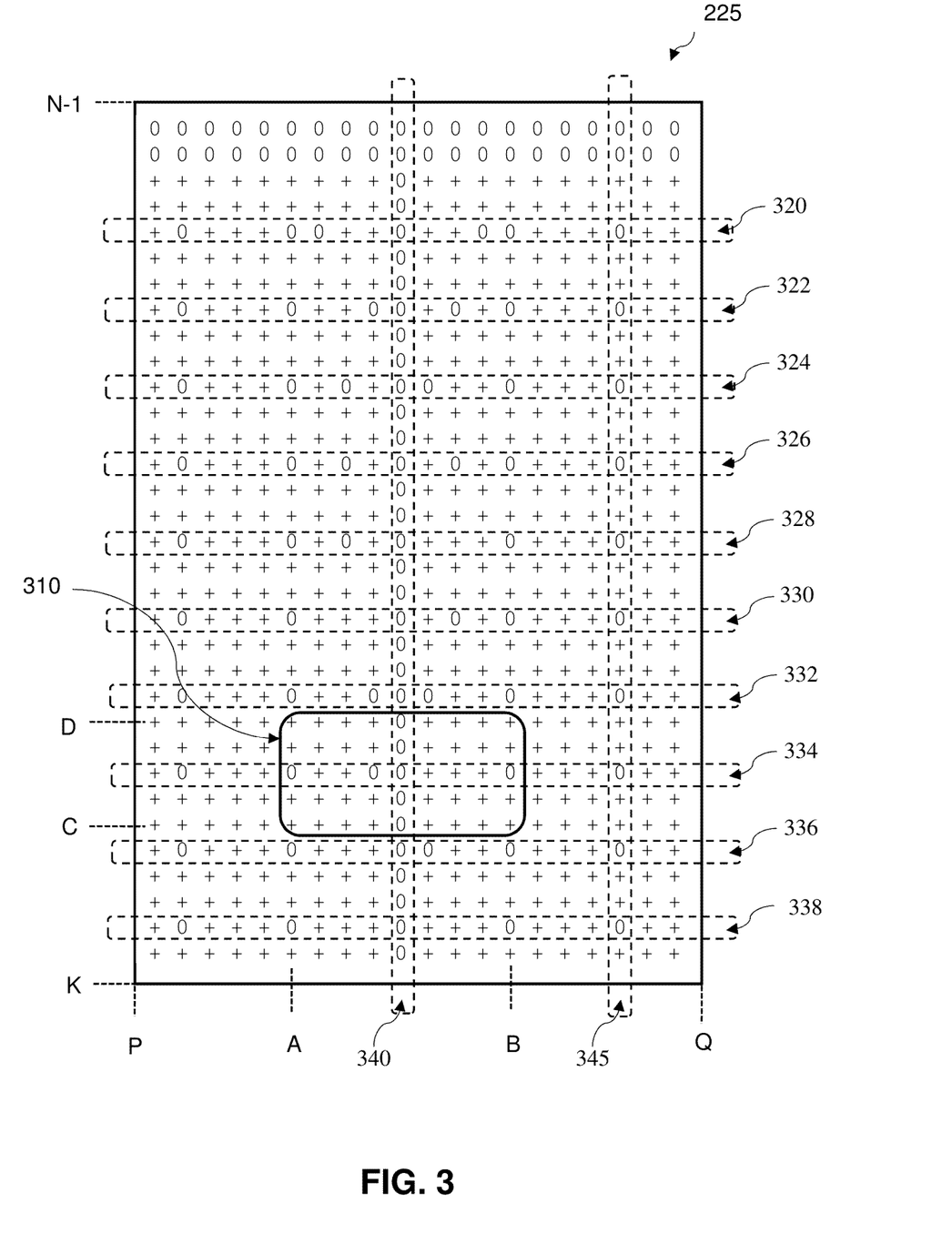
FIG. 3 is a diagram illustrating a DMD registration pattern in a region near the edge of the mesa.

FIG. 3 is a diagram illustrating a registration pattern in the region 225 near the edge of the mesa. In this example, the notation 0 corresponds to an OFF pixel and the notation + corresponds to an ON pixel.

The pattern has the following properties:

1) The OFF pixels form a concentric shape that mimics the mesa shape. The number of concentric shapes should be more than enough to account for manufacturing tolerance in mesa fabrication.

2) One or more axis on each side may have a single column (or row reference) of OFF pixels to aid in identifying the center axis. This axis will provide a known column (or row reference) of the DMD pixels. For example, the column 340 is at the center of the SLM array and can serve as a reference line for identification.

3) Pixels around the center axis are OFF to create a unique pattern on each field of view image. Patterns along the x dimension or the y dimension should be unique. A basic property of uniqueness is that no repetition is allowed.

4) Field of view should capture one pixel width/height outside of mesa to verify edge of imprint.

5) Spacing in X and Y should be such that one column or row of modified pixels is always in view.

6) Spacing in X and Y should be calculated by (ceiling(pixel size/dimension) + 1)/2. For example, if one dimension is 4.5 DMD pixels in FOV, spacing should be (ceiling(4.5) + 1)/2 = 3. Therefore, every $3^{rd}$ pixel in that dimension should be a modified pixel.

The rows 320, 322, 324, 326, 328, 330, 332, 334, 336, and 338 each contains a unique pattern that will allow fast recognition and registration. These patterns are different from each other, and therefore there cannot be confusion or mistake in registration. To illustrate, the pattern 310 as seen in a field of view, typically magnified at 20X, will be shown and explained in FIG. 4. At such a high magnification, only a small portion such as the pattern 310 is visible during inspection. Therefore, the pattern 310 may be a visible portion under a high magnification such as 20X.

Figure 4:
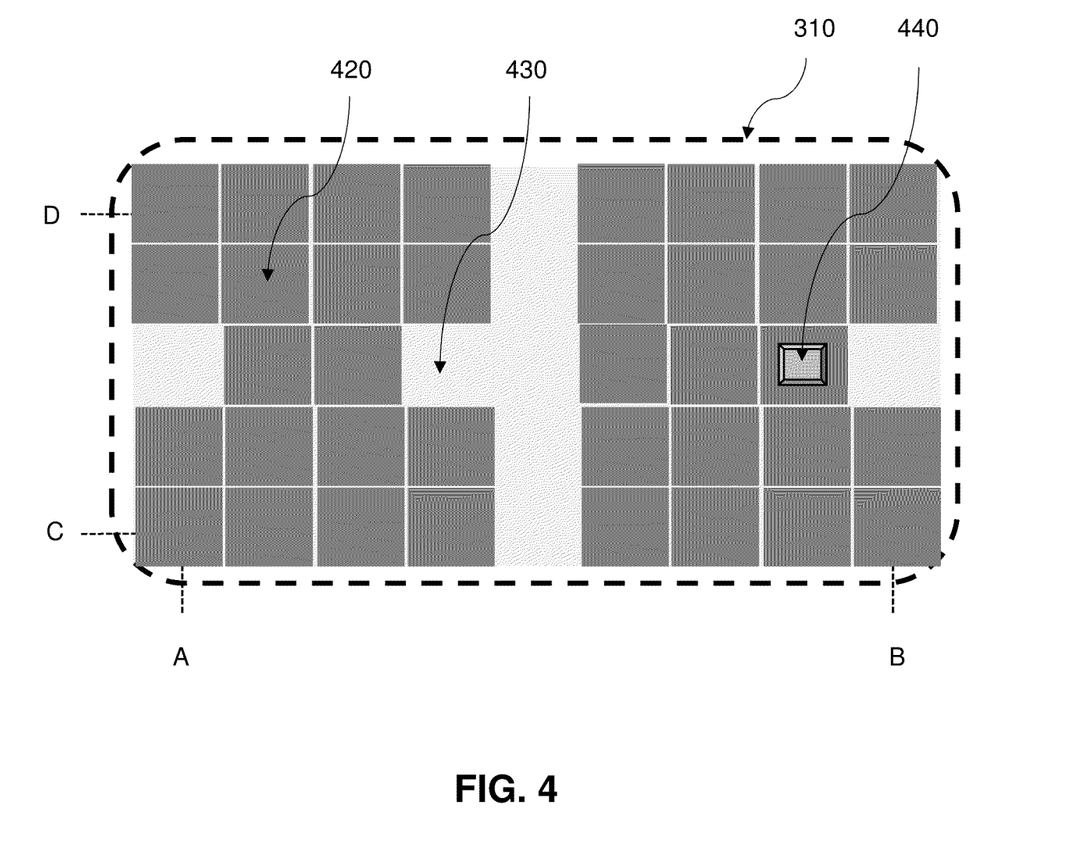
FIG. 4 is a diagram illustrating a DMD registration pattern in a field of view.

FIG. 4 is a diagram illustrating the DMD registration pattern 310 in a field of view. The pattern 310 includes a dark shaded area and a light shaded area. The dark and light shaded areas correspond to the ON and OFF pixels, respectively. Note further that in this example, there is a fiduciary mark 440, that helps further with the registration.

Within the rectangle 310, the center row has a unique combination of two ON pixels on the left and three ON pixels on the right of the center column 340. The two pixels on the left are further limited by two OFF pixels on each end. The three pixels of the right is limited by an OFF pixel at the rightmost end. There is no other pattern that has that combination. Accordingly, once the pattern is known, it can be quickly recognize and identify.

Figure 5:
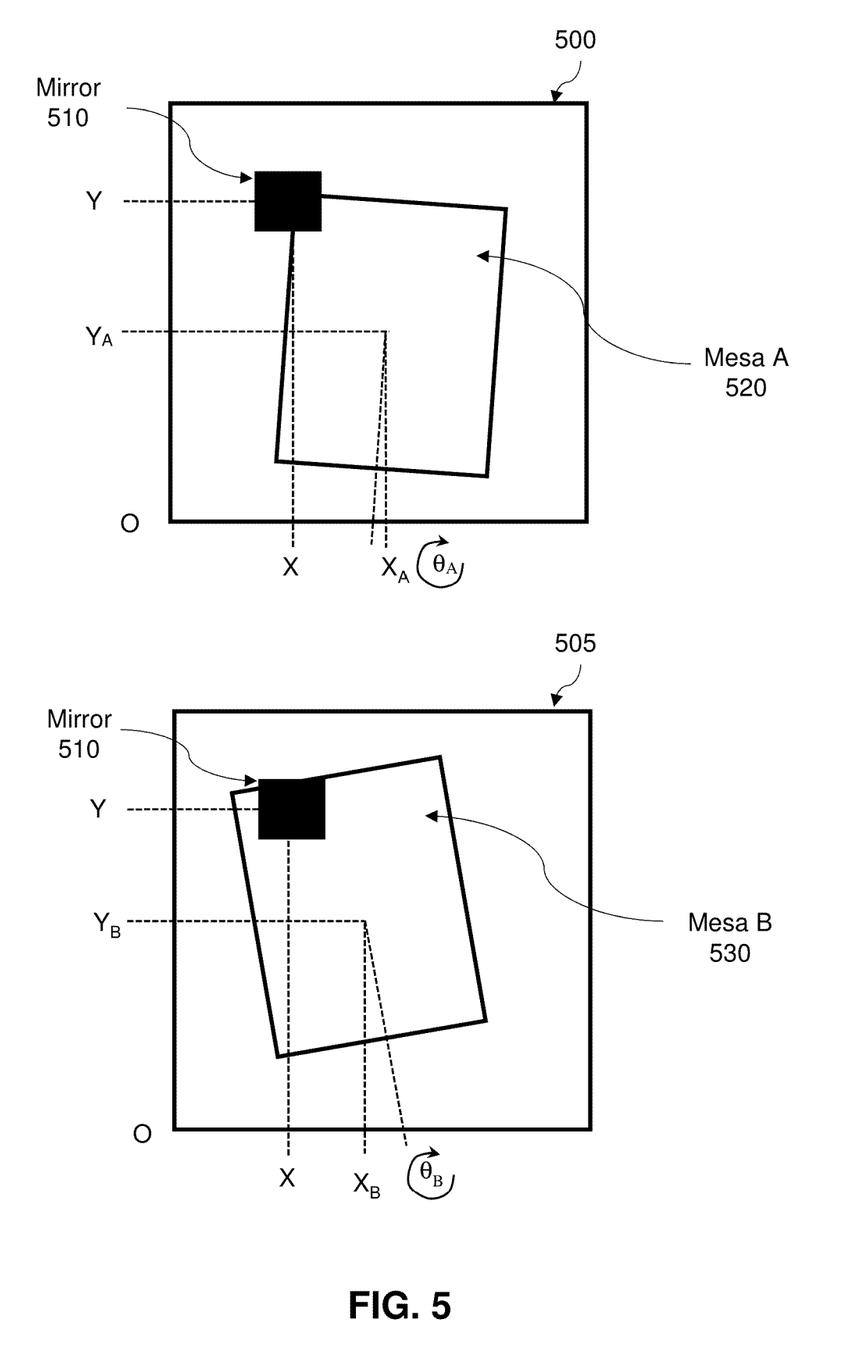
FIG. 5 is a diagram illustrating adjustment of the registration from two mesa.

FIG. 5 is a diagram illustrating adjustment of the registration from two mesa. In FIG. 5, there are two scenarios depicted by two rectangles 500 and 505 which correspond to two mesas A and B, respectively.

In the rectangle 500, the mesa A 520 has a center at $(x_A, y_A)$ and is slightly rotated to the right with respect of the mirror 510 with an angle $\theta_A$. The mesa B 530 has a center at $(x_B, y_B)$ and is slightly rotated to the left with respect of the mirror 510 with an angle $\theta_B$. By proper registration, the coordinates of interest points on mesas A and B can be located. The interest points may be the center, the corner points, etc.. Once the coordinates of these interest points are obtained, a transformation can be performed to adjust the error. This transformation may involve the calculation of the rotation angle.

Figure 6:
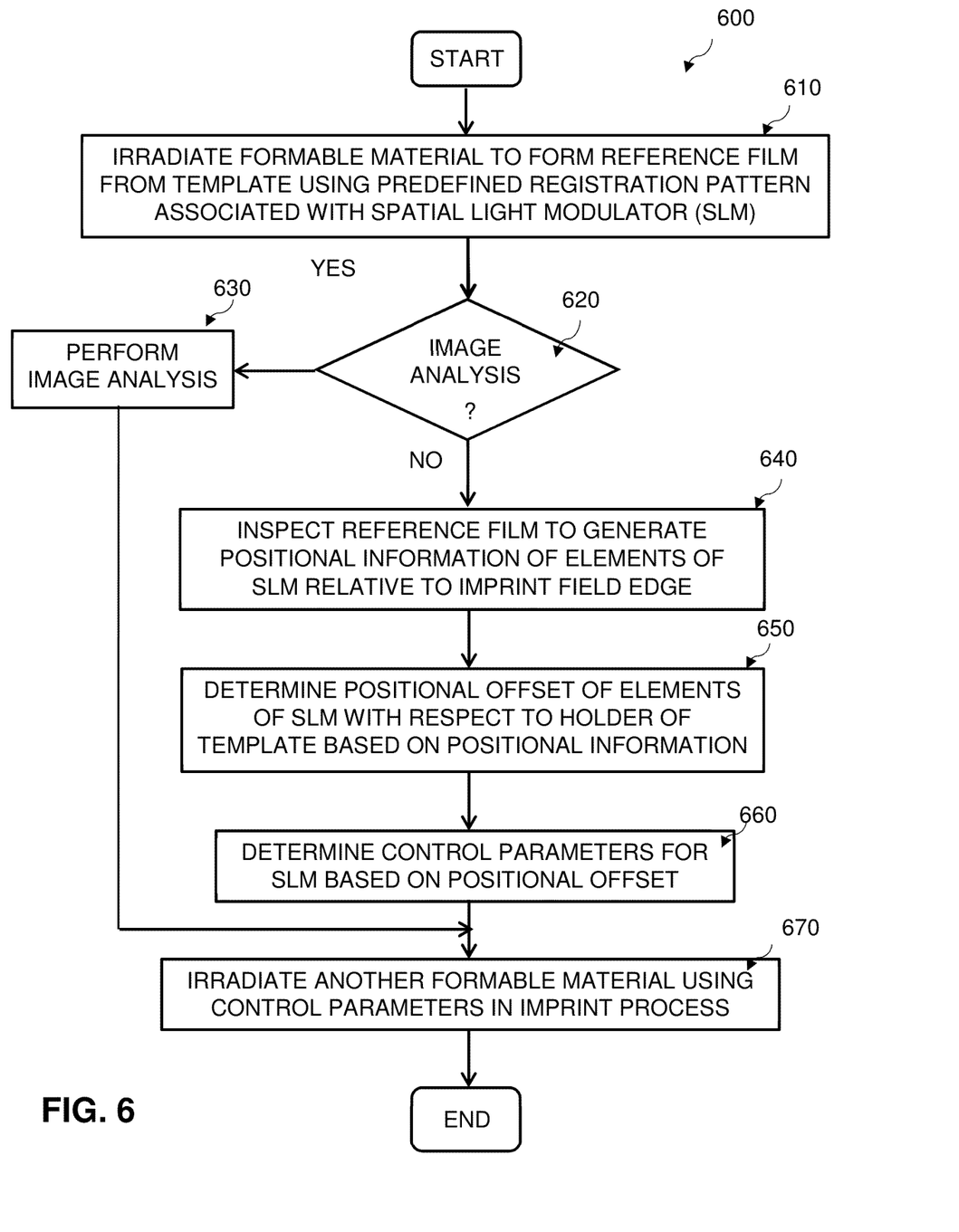
FIG. 6 is a flowchart illustrating a process to perform DMD registration.

FIG. 6 is a flowchart illustrating a process 600 to perform DMD registration. The flowchart represents the operations that are performed by the controller 170 by executing a program stored in memory as will be shown in FIG. 8.

Upon START, the process 600 irradiates a formable material in contact with the template (e.g., the formable material 152 shown in FIG. 1) to form a reference film from using a predefined registration pattern associated with the SLM (Block 610). The predefined registration pattern is one similar to that shown in FIGS. 3 and 4. The result is the cured pattern having the predefined pattern. Next, the process 600 determines if it is desired to perform an image analysis (Block 620). An image analysis is a process that performs inspection by computer, or automatically. If so, the process proceeds to perform the image analysis (Block 630). Block 630 will be explained in FIG. 7.

If image analysis is not desired (NO branch at Block 620), the process 600 proceeds to inspect the reference film to generate positional information of the elements of the SLM relative to the imprint field edge or edges (Block 640). The inspection may be done manually or semiautomatically by combining operator's input and computer processing. As explained above, the positional information can be easily generated because the pattern is unique and can be quickly recognized.

Then, the process 600 determines a positional offset of the elements of the SLM with respect to the template holder of the template, or the template chuck (Block 650). Next, the process 600 determines the control parameters for SLM based on the positional offset (Block 660). The control parameters may be the transformation parameters as calculated above. For example, based on the obtained coordinates of the corresponding interest points, we can compute the rotation angle and the translation amount. The scale factor is assumed to be unchanged. From these control parameters, correction or adjustment can be made. Next, the process 600 irradiates another formable material using the control parameters determined in Block 660 above in an imprint process using the system 100 (Block 670). The process 600 is then terminated.

Figure 7:
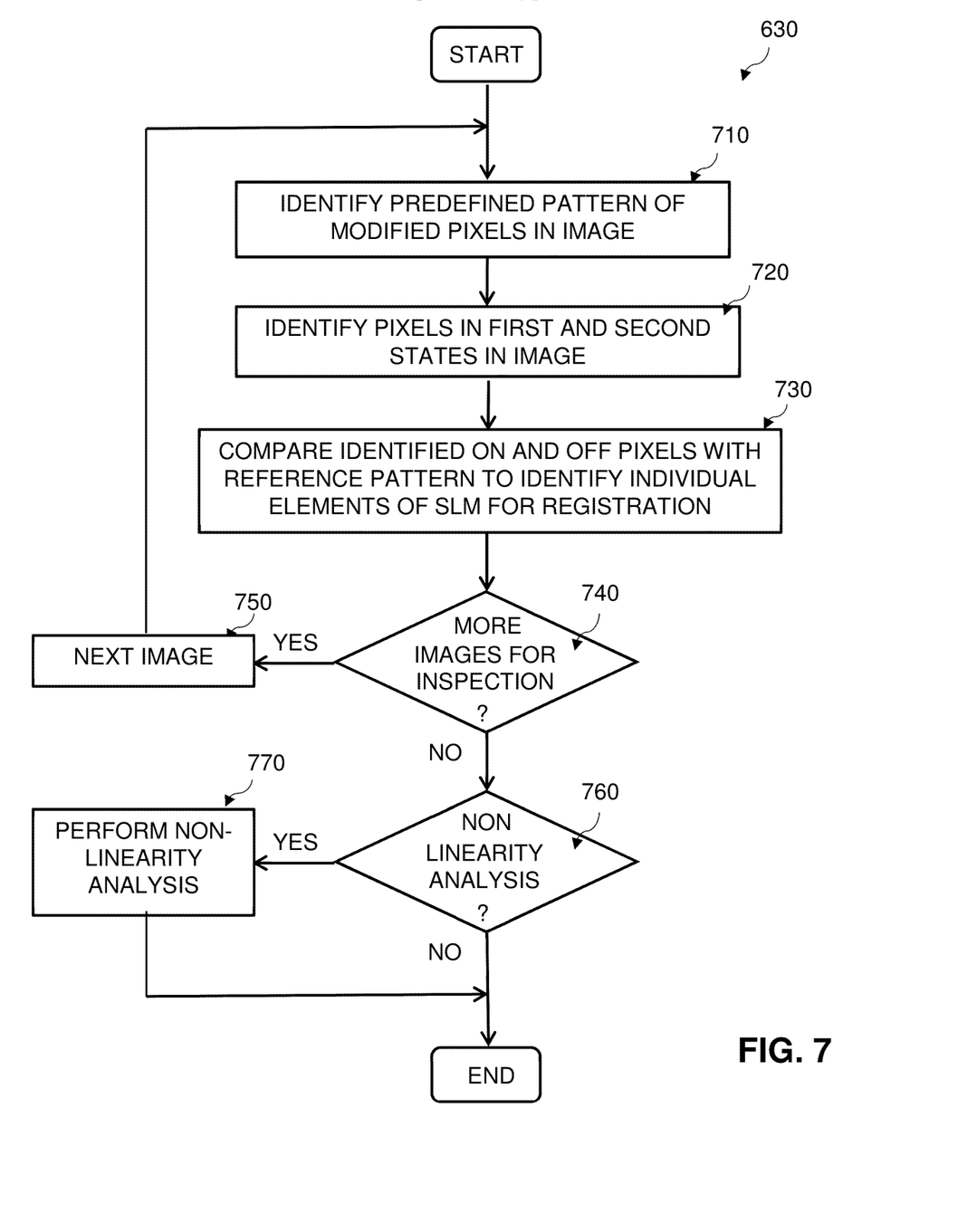
FIG. 7 is a flowchart illustrating a process to identify pixels using an image analyzer.

FIG. 7 is a flowchart illustrating the process 630 to identify pixels using an image analyzer. The process 630 is an automatic process, performed by computer in the inspection of the reference film. Techniques in image matching, finding correspondence can be employed.

Upon START, the process 630 identifies a predefined pattern of modified pixels in the image (Block 710). The modified pixels correspond to the OFF pixels as illustrated in FIGS. 3 and 4. The image is the image of the reference film after the curing is complete. This step is to establish the column axis or row axis. Since the column axis consists entirely of OFF pixels, the identification can be done quickly, simply by counting the number of OFF pixels in the column.

Next, the process 630 identifies the pixels in first and second states in the image (Block 720). The first and second states are the ON and OFF states, respectively. Since the pattern is predefined and is unique, the identification can be done quickly by a matching operation.

Next, the process 630 compares the identified ON and OFF pixels with the reference pattern to identify the individual elements of the SLM for registration (Block 730).

Next, the process 630 determines if there are more images for inspection (Block 740). If so, the process 630 goes to the next image (Block 750) and returns to Block 710. Otherwise, the process 630 determines if it is desired to perform non-linearity analysis (Block 760). A non-linearity analysis refers to analysis of non-linearity due to errors such as lens distortions or non-planarity of the DMD or the wafer plane. If so, the process 630 performs the non-linearity analysis (Block 770). This may be performed by determining the statistics (e.g., variances) of the errors. The process 630 is then terminated.

Figure 8:
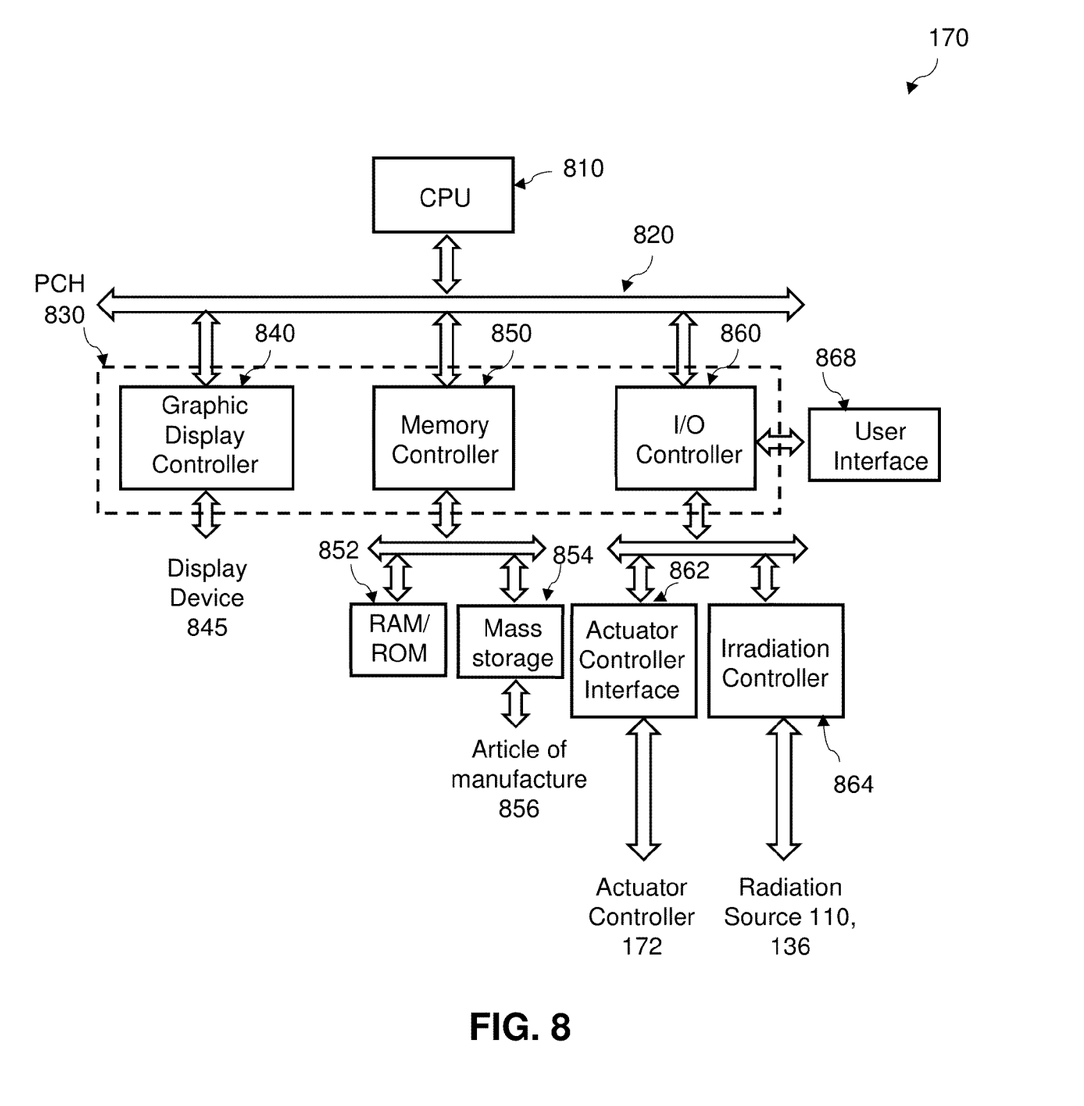
FIG. 8 is a diagram illustrating the controller.

FIG. 8 is a diagram illustrating the controller 170 shown in FIG. 1. The controller 170 includes a central processing unit (CPU) or a processor 810, a bus 820, and a platform controller hub (PCH) 830. The PCH 830 may include a graphic display controller (GDC) 840, a memory controller 850, an input/output (I/O) controller 860, and a mass storage controller 854. The processing and control system 170 may include more or less than the above components. In addition, a component may be integrated into another component. As shown in FIG. 8, all the controllers 840, 850, and 860 are integrated in the PCH 830. The integration may be partial and/or overlapped. For example, the GDC 840 may be integrated into the CPU 810, the I/O controller 860 and the memory controller 850 may be integrated into one single controller, etc.

The CPU or processor 810 is a programmable device that may execute a program or a collection of instructions to carry out a task. It may be a general-purpose processor, a digital signal processor, a programmable processor, a microcontroller, or a specially designed processor such as one design from Applications Specific Integrated Circuit (ASIC). It may include a single core or multiple cores.

Each core may have multi-way multi-threading. The CPU 810 may have simultaneous multithreading feature to further exploit the parallelism due to multiple threads across the multiple cores. In addition, the CPU 810 may have internal caches at multiple levels.

The bus 820 may be any suitable bus connecting the CPU 810 to other devices, including the PCH 830. For example, the bus 820 may be a Direct Media Interface (DMI).

The PCH 830 in a highly integrated chipset that includes many functionalities to provide interface to several devices such as memory devices, input/output devices, storage devices, network devices, etc.

The I/O controller 860 controls input devices (e.g., stylus, keyboard, and mouse, microphone, image sensor) and output devices (e.g., audio devices, speaker, scanner, printer). It also has interface to a network interface card which provides interface to a network and wireless controller (not shown).

The memory controller 850 controls memory devices such as the random access memory (RAM) and/or the read-only memory (ROM)1052, and other types of memory such as the cache memory and flash memory. The RAM 852 may store instructions or programs, loaded from a mass storage device such as a non-transitory article of manufacture 856 that contains the instructions or programs, that, when executed by the CPU 810, cause the CPU 810 to perform operations as described above. It may also store data used in the operations. The ROM 852 may include instructions, programs, constants, or data that are maintained whether it is powered or not. The instructions or programs may correspond to the functionalities described above, such as the template registration 180.

The GDC 840 controls a display device and provides graphical operations. It may be integrated inside the CPU 810. It typically has a graphical user interface (GUI) to allow interactions with a user who may send a command or activate a function. The GDC 840 may display, on the display device, images of the curing regions.

The mass storage controller 854 controls the mass storage devices such as CD-ROM and hard disk or the non-transitory article of manufacture 856.

The I/O controller 860 may include an actuator controller interface 862 and an irradiation controller 864. The actuator controller interface 862 is configured to couple to the actuator controller 172 (shown in FIG. 1). It may include switching circuits, drive circuits, and a micrometer drive. The micrometer drive may include a motorized actuator with micron, sub-micron, or sub-nano resolution. The irradiation controller 864 may include drive and timing circuits to control the radiation source 110.

Additional devices or bus interfaces may be available for interconnections and/or expansion. Some examples may include the Peripheral Component Interconnect Express (PCIe) bus, the Universal Serial Bus (USB), etc.

A manufacturing method of a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus or imprint method described above. The manufacturing method further includes a step of processing the substrate on which the pattern has been formed. The processing step may include a step of removing the residual film of the pattern. The processing step may also include another known step such as a step of etching the substrate using the pattern as a mask. The method of manufacturing the article according to this embodiment is superior to a conventional method in at least one of the performance, quality, productivity, and production cost of the article All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

The method or instructions that cause the processor to perform the operations described above may be stored on a non-transitory storage medium or article of manufacture such as an optical storage device.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising:
 a processor; and
 a memory storing instructions that, when executed by the processor, cause the processor to perform operations comprising:
  irradiating a formable material in contact with a template to form a reference film using a predefined registration pattern associated with a spatial light modulator (SLM),
  inspecting the reference film to generate positional information of the elements of the SLM relative to an imprint field edge,
  determining positional offset of the elements of the SLM with respect to a holder of the template based on the positional information, and
  determining control parameters for the SLM based on the positional offset,
  wherein the predefined registration pattern has a unique pattern in at least one dimension.

2. The apparatus according to claim 1, wherein the SLM is a Digital Micromirror/ Mirror Device (DMD).

3. The apparatus according to claim 2, wherein the predefined registration pattern is viewed in a field of view (FOV).

4. The apparatus according to claim 2, wherein the predefined registration pattern has modified elements corresponding to the SLM in a concentric shape.

5. The apparatus according to claim 1, wherein the predefined registration pattern is viewed in a field of view (FOV).

6. The apparatus according to claim 5, wherein the predefined registration pattern has no repetitive section.

7. The apparatus according to claim 1, wherein the predefined registration pattern includes elements corresponding to the SLM on a column or row dimension being all in a first state.

8. The apparatus according to claim 1, wherein the operations, when in the image analysis mode, further comprising:
identifying a predefined pattern of modified pixels in an image of the reference film; and
identifying pixels in first and second states.

9. The apparatus according to claim 8, wherein the operations, when in the image analysis mode, further comprising:
performing a non-linearity analysis.

10. A method comprising:
irradiating a formable material under a template to form a reference film using a predefined registration pattern associated with a spatial light modulator (SLM),
inspecting the reference film to generate positional information of the elements of the SLM relative to an imprint field edge,
determining positional offset of the elements of the SLM with respect to a holder of the template based on the positional information, and
determining control parameters for the SLM based on the positional offset,
wherein the predefined registration pattern has a unique pattern in at least one dimension.

11. The method according to claim 10, wherein the SLM is a Digital Micromirror/ Mirror Device (DMD).

12. The method according to claim 11, wherein the predefined registration pattern is viewed in a field of view (FOV).

13. The method according to claim 11, wherein the predefined registration pattern has modified elements corresponding to the SLM in a concentric shape.

14. The method according to claim 10, wherein the predefined registration pattern is viewed in a field of view (FOV).

15. The method according to claim 14, wherein the predefined registration pattern has no repetitive section.

16. The method according to claim 10, wherein the predefined registration pattern includes elements corresponding to the SLM on a column or row dimension being all in a first state.

17. The method according to claim 10, wherein the operations, when in the image analysis mode, further comprising:
identifying a predefined pattern of modified pixels in an image of the reference film; and
identifying pixels in first and second states.

18. The apparatus according to claim 17, wherein the operations, when in the image analysis mode, further comprising:
performing a non-linearity analysis.

19. A method of manufacturing an article, the method comprising:
forming a pattern on a substrate using a method according to claim 10; and
processing the substrate on which the pattern has been formed to obtain the article.

20. A system comprising:
a radiation source;
a spatial light modulator (SLM) having a plurality of elements to modulate light from the radiation source;
an imprint assembly comprising:
a template holder to hold a template;
a substrate holder to hold substrate having a surface on which a formable material is deposited;
a processor; and
a memory storing instructions that, when executed by the processor, cause the processor to perform operations comprising:
irradiating the formable material under the template to form a reference film using a predefined registration pattern associated with the SLM,
inspecting the reference film to generate positional information of the elements of the SLM relative to an imprint field edge,
determining positional offset of the elements of the SLM with respect to a holder of the template based on the positional information, and
determining control parameters for the SLM based on the positional offset,
wherein the predefined registration pattern has a unique pattern in at least one dimension.

* * * * *